United States Patent
Hagimoto

(10) Patent No.: US 11,329,077 B2
(45) Date of Patent: May 10, 2022

(54) SEMICONDUCTOR DEVICE WITH A THROUGH ELECTRODE RECEPTION PART WIDER THAN A THROUGH ELECTRODE, SOLID-STATE IMAGING DEVICE, AND ELECTRONIC EQUIPMENT

(71) Applicant: SONY SEMICONDUCTOR SOLUTIONS CORPORATION, Kanagawa (JP)

(72) Inventor: Yoshiya Hagimoto, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 107 days.

(21) Appl. No.: 16/496,773

(22) PCT Filed: Mar. 16, 2018

(86) PCT No.: PCT/JP2018/010394
§ 371 (c)(1),
(2) Date: Sep. 23, 2019

(87) PCT Pub. No.: WO2018/180576
PCT Pub. Date: Oct. 4, 2018

(65) Prior Publication Data
US 2021/0111204 A1    Apr. 15, 2021

(30) Foreign Application Priority Data

Mar. 31, 2017 (JP) ............................. JP2017-072361

(51) Int. Cl.
*H01L 27/146* (2006.01)
*H01L 23/48* (2006.01)
(Continued)

(52) U.S. Cl.
CPC .. *H01L 27/14603* (2013.01); *H01L 21/76898* (2013.01); *H01L 23/481* (2013.01);
(Continued)

(58) Field of Classification Search
CPC ........... H01L 27/14634; H01L 27/1464; H01L 21/76898; H01L 23/481; H01L 23/5226;
(Continued)

(56) References Cited

U.S. PATENT DOCUMENTS 6,261,949 B1    7/2001   Sukekawa
6,686,270 B1    2/2004   Subramanian et al.
(Continued)

FOREIGN PATENT DOCUMENTS

CN    1672255 A      9/2005
CN    104576668 A    4/2015
(Continued)

OTHER PUBLICATIONS

International Search Report and Written Opinion of PCT Application No. PCT/JP2018/010394, dated May 1, 2018, 12 pages of ISRWO.

*Primary Examiner* — Younes Boulghassoul
(74) *Attorney, Agent, or Firm* — Chip Law Group

(57) ABSTRACT

The present technology relates to a semiconductor device, a solid-state imaging device, and electronic equipment, which are able to suppress increase of resistivity to a high level at a connection portion between an ESV and a wiring layer and to improve reliability of an electric connection using an ESV. The semiconductor device according to the present technology has a plurality of semiconductor substrates layered, and includes a through electrode penetrating a silicon layer of the semiconductor substrates, a wiring layer formed inside the semiconductor substrates, and a through electrode reception part. The through electrode reception part is con-
(Continued)

nected to the wiring layer, in which the through electrode has a width smaller than the through electrode reception part, and the through electrode is electrically connected to the wiring layer via the through electrode reception part. The present technology is applicable, for example, to a CMOS image sensor.

9 Claims, 14 Drawing Sheets

(51) Int. Cl.
    *H01L 25/065*    (2006.01)
    *H01L 23/538*    (2006.01)
    *H01L 21/768*    (2006.01)

(52) U.S. Cl.
    CPC ...... *H01L 23/5384* (2013.01); *H01L 25/0657* (2013.01); *H01L 27/1464* (2013.01); *H01L 27/1469* (2013.01); *H01L 27/14625* (2013.01); *H01L 27/14634* (2013.01); *H01L 27/14636* (2013.01); *H01L 27/14683* (2013.01); *H01L 2225/06541* (2013.01); *H01L 2225/06548* (2013.01)

(58) Field of Classification Search
CPC ........... H01L 23/5384; H01L 27/14636; H01L 2225/06541; H01L 2225/06544; H01L 2225/06548; H01L 25/0652; H01L 25/0657; H01L 25/071; H01L 25/074; H01L 25/117; H01L 21/185–187; H01L 27/1469; H01L 25/16; H01L 27/14683
See application file for complete search history.

(56) References Cited

U.S. PATENT DOCUMENTS

| | | | | |
|---|---|---|---|---|
| 2008/0087932 | A1* | 4/2008 | Son | H01L 23/485 257/315 |
| 2009/0108464 | A1 | 4/2009 | Uchiyama | |
| 2010/0225005 | A1* | 9/2010 | Nishio | H01L 25/0657 257/774 |
| 2011/0304057 | A1* | 12/2011 | Matsumoto | H01L 23/481 257/774 |
| 2012/0181602 | A1* | 7/2012 | Fukuzumi | H01L 27/1207 257/326 |
| 2012/0248580 | A1* | 10/2012 | Matsugai | H01L 25/0657 257/621 |
| 2013/0321680 | A1* | 12/2013 | Kumano | H01L 27/1464 348/273 |
| 2014/0091414 | A1* | 4/2014 | Shimotsusa | H01L 27/14636 257/431 |
| 2014/0264709 | A1* | 9/2014 | Tsai | H01L 21/76879 257/459 |
| 2015/0035103 | A1* | 2/2015 | Inoue | H01L 27/1464 257/432 |
| 2015/0097258 | A1* | 4/2015 | Shigetoshi | H01L 21/76898 257/432 |
| 2015/0221695 | A1* | 8/2015 | Park | H01L 25/0657 257/774 |
| 2015/0270307 | A1* | 9/2015 | Umebayashi | H01L 27/14612 257/292 |
| 2016/0005781 | A1* | 1/2016 | Lin | H01L 27/14623 257/292 |
| 2016/0254299 | A1* | 9/2016 | Gomi | H01L 27/14634 257/447 |
| 2017/0092680 | A1* | 3/2017 | Kwon | H01L 23/5226 |
| 2017/0154873 | A1* | 6/2017 | Kim | H01L 24/02 |
| 2017/0186799 | A1* | 6/2017 | Lin | H01L 25/50 |
| 2018/0145104 | A1* | 5/2018 | Kim | H01L 27/14638 |
| 2018/0240797 | A1* | 8/2018 | Yokoyama | H01L 25/074 |

FOREIGN PATENT DOCUMENTS

| | | |
|---|---|---|
| EP | 1527478 A1 | 5/2005 |
| GB | 2336243 A | 10/1999 |
| JP | 11-297820 A | 10/1999 |
| JP | 2001-326325 A | 11/2001 |
| JP | 2005-535123 A | 11/2005 |
| JP | 2009-111061 A | 5/2009 |
| JP | 2010-205990 A | 9/2010 |
| JP | 2012-243953 A | 12/2012 |
| JP | 2013-046006 A | 3/2013 |
| JP | 2015-076502 A | 4/2015 |
| KR | 10-1999-0082962 A | 11/1999 |
| KR | 10-2005-0032111 A | 4/2005 |
| TW | 409357 B | 10/2000 |
| WO | 2004/013907 A1 | 2/2004 |
| WO | 2010/023812 A1 | 3/2010 |
| WO | 2010/100705 A1 | 9/2010 |

\* cited by examiner

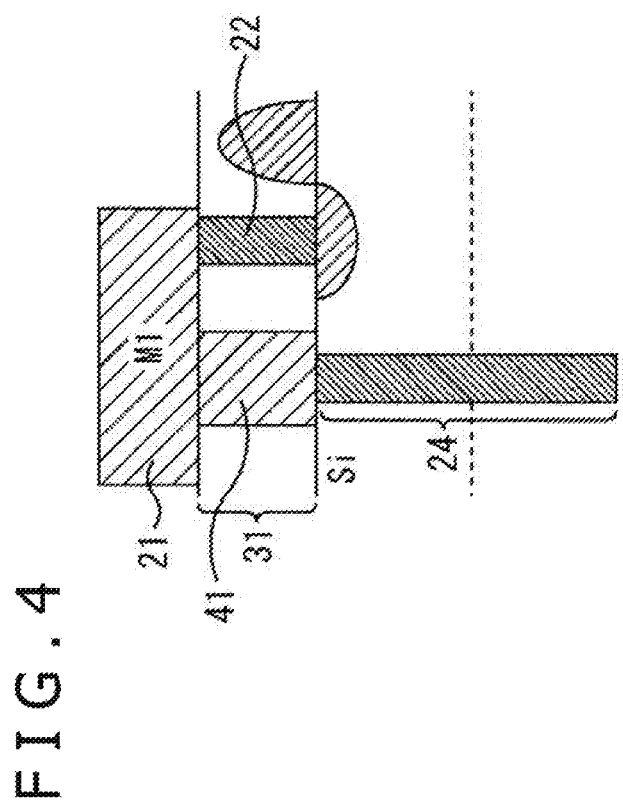

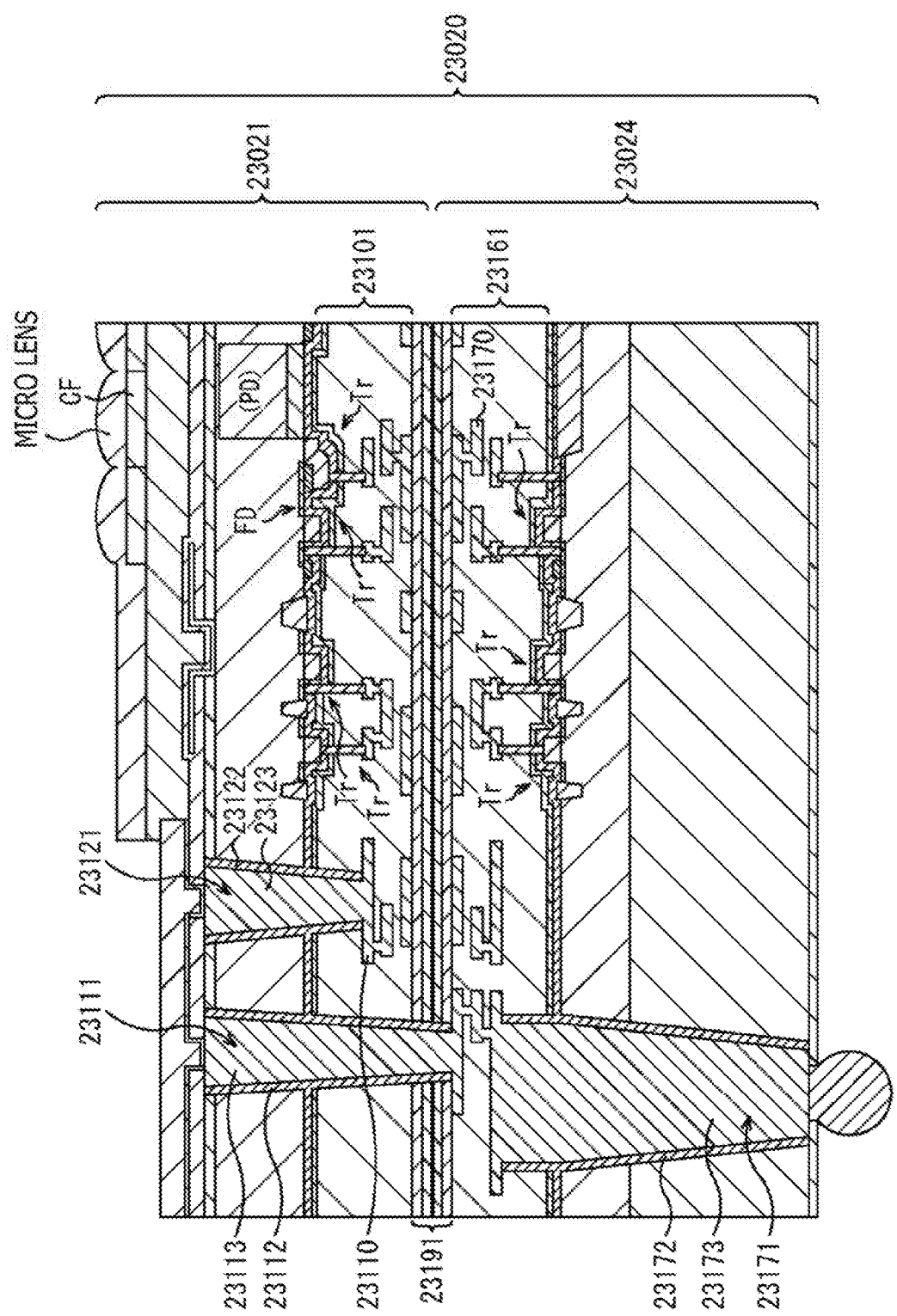

SEMICONDUCTOR DEVICE WITH A THROUGH ELECTRODE RECEPTION PART WIDER THAN A THROUGH ELECTRODE, SOLID-STATE IMAGING DEVICE, AND ELECTRONIC EQUIPMENT

CROSS REFERENCE TO RELATED APPLICATIONS

This application is a U.S. National Phase of International Patent Application No. PCT/JP2018/010394 filed on Mar. 16, 2018, which claims priority benefit of Japanese Patent Application No. JP 2017-072361 filed in the Japan Patent Office on Mar. 31, 2017. Each of the above-referenced applications is hereby incorporated herein by reference in its entirety.

TECHNICAL FIELD

The present technology relates to a semiconductor device, a solid-state imaging device, and electronic equipment, and more particularly to a semiconductor device, a solid-state imaging device, and electronic equipment in which layered semiconductor substrates are electrically connected via through electrodes.

BACKGROUND ART

Conventionally, in a semiconductor device configured by layering a plurality of semiconductor substrates, there is a technology for electrically connecting the layered semiconductor substrates by through electrodes penetrating the semiconductor substrates (for example, see PTL 1).

Recently, for a purpose of downsizing and power saving of multilayer layered devices, development of a technology for forming a TSV by further miniaturizing a conventional through electrode has become important.

CITATION LIST

Patent Literature

[PTL 1]
Japanese Patent Laid-Open No. 2015-154020

SUMMARY

Technical Problems

In forming a TSV, a through hole is opened in semiconductor substrates, a barrier metal (such as titanium or titanium nitride) is formed on an inner wall of the through hole, and then, an electrode material (such as tungsten) is filled. However, in a case in which the TSV has a high aspect ratio structure, a step of forming the barrier metal on the inner wall of the through hole tends to be insufficient. In that case, an alloy reaction proceeds between the electrode material (such as tungsten) filled in the through hole and a metal (such as copper) forming a wiring layer of a connection destination. As a result, a connection portion between the TSV and the wiring layer results in increase of resistivity to a high level, and reliability of an electrical connection may be deteriorated.

The present technology has been made in view of such a situation, and suppresses increase of resistivity to a high level at a connection portion between a TSV and a wiring layer and improves reliability of an electric connection using a TSV.

Solution to Problems

A semiconductor device according to a first aspect of the present technology has a plurality of semiconductor substrates layered, the semiconductor device including: a through electrode penetrating a silicon layer of the semiconductor substrates; a wiring layer formed inside the semiconductor substrates; and a through electrode reception part connected to the wiring layer, in which the through electrode has a width smaller than the through electrode reception part, and the through electrode is electrically connected to the wiring layer via the through electrode reception part.

The through electrode reception part can be formed by the same metal as the through electrode or the wiring layer.

The through electrode reception part and the through electrode can include tungsten.

The semiconductor device according to the first aspect of the present technology can further include a source contact connected to the wiring layer, in which the through electrode reception part can be formed simultaneously with the source contact.

The through electrode reception part and the wiring layer can include copper.

The through electrode reception part can be formed simultaneously with the wiring layer by a dual damascene method.

A barrier metal can be formed at an interface between the through electrode reception part and the through electrode.

The barrier metal can be provided on a side wall of the through electrode.

The barrier metal can be provided on a side wall of the through electrode reception part.

The barrier metal can include titanium or titanium nitride.

The through electrode can include an ESV (Extreme Small Through Silicon Via).

A diameter of the through electrode can be 1 [μm] or less, and an aspect ratio may be 10 or more.

A solid-state imaging device according to a second aspect of the present technology has a plurality of semiconductor substrates layered, a PD (photodiode) formed on at least one semiconductor substrate among the plurality of the semiconductor substrates, the solid-state imaging device including: a through electrode penetrating a silicon layer of the semiconductor substrates; a wiring layer formed inside the semiconductor substrates; and a through electrode reception part connected to the wiring layer, in which the through electrode has a width smaller than the through electrode reception part, and the through electrode is electrically connected to the wiring layer via the through electrode reception part.

Electronic equipment according to a third aspect of the present technology has a plurality of semiconductor substrates layered, the electronic equipment including: a through electrode penetrating a silicon layer of the semiconductor substrates; a wiring layer formed inside the semiconductor substrates; and a through electrode reception part connected to the wiring layer, in which the through electrode has a width smaller than the through electrode reception part, and the through electrode is electrically connected to the wiring layer via the through electrode reception part.

In the first to third aspects of the present technology, the through electrode is electrically connected to the wiring layer via the through electrode reception part.

Advantageous Effects of Invention

According to the first and second aspects of the present technology, it is possible to suppress increase of resistivity to a high level at a connection portion between the TSV and a wiring layer and to improve reliability of an electric connection using the TSV.

BRIEF DESCRIPTION OF DRAWINGS

FIG. 4 is a cross-sectional view depicting a second exemplary configuration of the connection portion between the ESV and the M1 wiring layer.

FIG. 7 is a cross-sectional view depicting a first exemplary configuration of a layered solid-state imaging device 23020.

DESCRIPTION OF EMBODIMENT

Hereinafter, the best mode for performing the present technology (hereinafter, referred to as an embodiment) will be described in detail with reference to the drawings.

<An Exemplary Configuration of a Solid-State Imaging Device to which the Present Technology is Applied>

Figure 1:
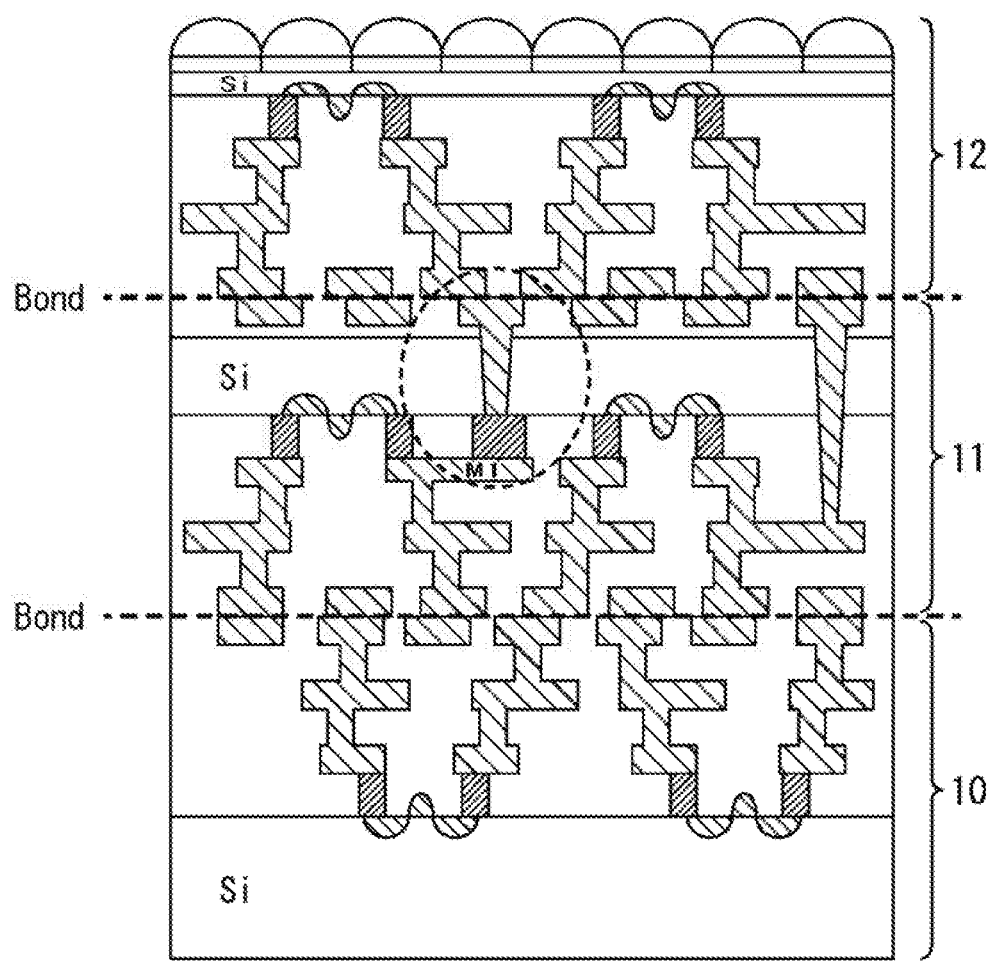
FIG. 1 is a cross-sectional view depicting an exemplary configuration of a solid-state imaging device to which the present technology is applied.

FIG. 1 is a cross-sectional view depicting an exemplary configuration of a solid-state imaging device to which the present technology is applied. This solid-state imaging device is configured by layering three semiconductor substrates, i.e., a lower layer substrate 10, an intermediate substrate 11, and an upper layer substrate 12.

In the lower layer substrate 10, for example, a logic circuit in the solid-state imaging device is formed. In the intermediate substrate 11, for example, a memory circuit of the solid-state imaging device is formed. In the upper layer substrate 12, for example, a sensor circuit (including a PD (photodiode), an FD (floating diffusion), a pixel Tr (transistor), etc.) of the solid-state imaging device are formed.

In the intermediate substrate 11 of the solid-state imaging device, an ESV is formed in a region indicated by a broken circle of the figure. The ESV is a TSV having a diameter of 1 [μm] or less and an aspect ratio of 10 or more. The ESV is formed through a silicon layer included in the intermediate substrate 11 and electrically connects M1 wiring layers of the upper layer substrate 12 and the intermediate substrate 11. The ESV is provided directly below the sensor circuit of the upper layer substrate 12. When connecting the upper layer substrate 12 and the intermediate substrate 11, if a width of the through electrode is large, a large number of through electrodes could not be installed. Since the ESV has a smaller diameter than through electrodes in the past, this problem can be solved.

The present technology relates to a connection portion between the ESV and the M1 wiring layer in a region indicated by the broken circle in FIG. 1.

<A First Exemplary Configuration of a Connection Portion Between an ESV and an M1 Wiring Layer>

Figure 2:
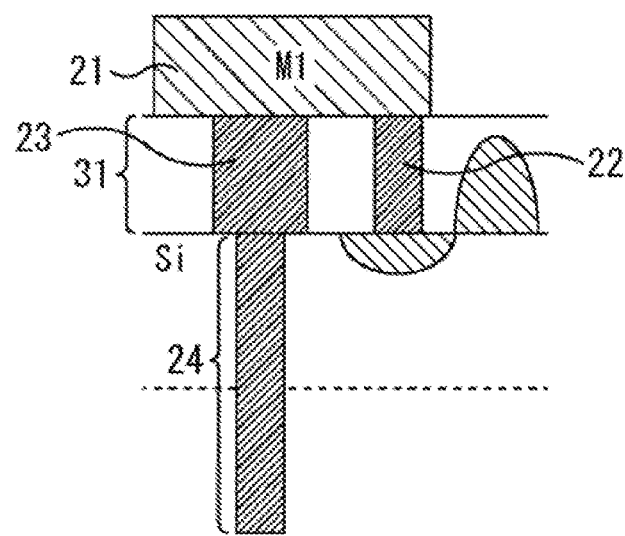
FIG. 2 is a cross-sectional view depicting a first exemplary configuration of a connection portion between an ESV and an M1 wiring layer.

FIG. 2 is a cross-sectional view depicting a first exemplary configuration of a connection portion between an ESV and an M1 wiring layer. Here, FIG. 2 is a view in which FIG. 1 is turned upside down, and the upper layer substrate 12 (not illustrated) is present on a lower side of FIG. 2.

The M1 wiring layer 21 of the intermediate substrate 11 includes, for example, copper. A source contact (CS) 22, which is formed in an interlayer film 31, and for example, includes tungsten, is connected to the M1 wiring layer 21. Further, an ESV reception part 23, which is formed in the interlayer film 31 and includes the same material (in this case, tungsten) as the source contact 22, is connected to the M1 wiring layer 21. An ESV 24 which includes the same material (in this case, tungsten) as the ESV reception part 23 and the width of which is smaller than that of the ESV reception part 23, is connected to the ESV reception part 23. Therefore, the ESV 24 is connected to the M1 wiring layer 21 via the ESV reception part 23.

Figure 3C:
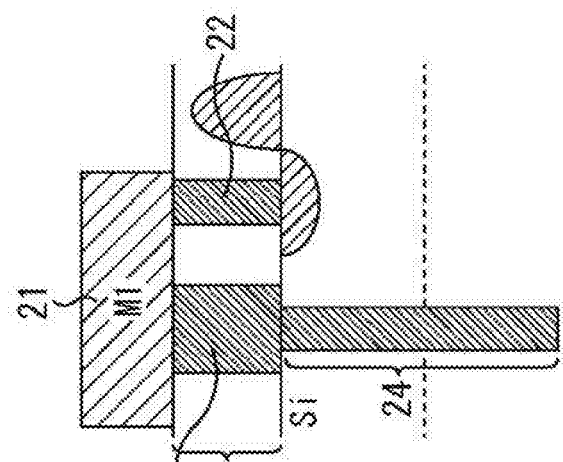
FIGS. 3A, 3B, and 3C are diagrams for explaining a manufacturing process of the first exemplary configuration illustrated in FIG. 2.
Figure 3B:
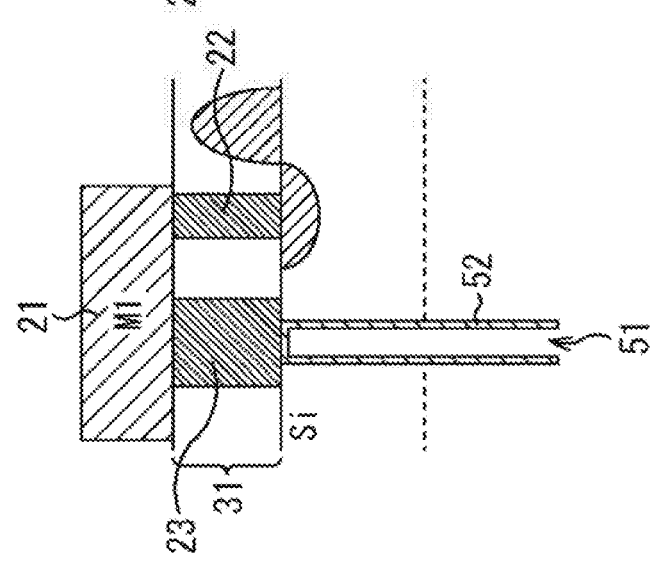
Figure 3A:
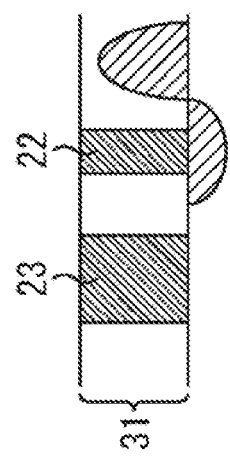

Next, FIGS. 3A, 3B, and 3C depict a manufacturing process of the first exemplary configuration of the connection portion between the ESV and the M1 wiring layer.

In a case of manufacturing the first exemplary configuration illustrated in FIG. 2, the ESV reception part 23 is also formed simultaneously with the formation of the source contact 22 including tungsten as illustrated in FIG. 3A. That is, when patterning the interlayer film 31 to form the source contact 22, patterning for the ESV reception part 23 is also performed simultaneously, and holes for the source contact 22 and the ESV reception part 23 are opened in the interlayer film 31. Then, tungsten is embedded in both holes, and the embedded tungsten is planarized by CMP (chemical mechanical polishing) to form the source contact 22 and the ESV reception part 23.

Next, as illustrated in FIG. 3B, after the M1 wiring layer 21 is formed on the planarized surfaces of the source contact 22 and the ESV reception part 23, a through hole 51 for the ESV 24 is opened to an ESV reception part 24. Then, a barrier metal (titanium, titanium nitride, etc.) 52 is formed on an inner wall of the through hole 51 by sputter film formation. Furthermore, as illustrated in FIG. 3C, the through hole 51, on which the barrier metal 52 is formed, is filled with tungsten to form the ESV 24.

As described above, when forming up to the ESV reception part 23 including tungsten, a length of the through hole becomes shorter and an aspect ratio of the ESV 24 becomes smaller as compared with a case of forming an ESV up to the M1 wiring layer 21. It is advantageous in performing sputter film formation, and a barrier metal may be formed sufficiently.

Therefore, since an alloying reaction of tungsten and copper in the connection portion between the ESV 24 and the M1 wiring layer 21 may be restrained, it is possible to suppress increase of resistivity to a high level at the connection portion and to improve reliability of an electric connection using the ESV 24.

<A Second Exemplary Configuration of the Connection Portion Between the ESV and the M1 Wiring Layer>

FIG. 4 is a cross-sectional view depicting a second exemplary configuration of the connection portion between the ESV and the M1 wiring layer. Here, FIG. 4 is a view in which FIG. 1 is turned upside down, and the upper layer substrate 12 (not illustrated) is present on a lower side of FIG. 4.

In the second exemplary configuration, the ESV reception part 23 including tungsten in the first exemplary configuration illustrated in FIG. 2 is replaced with an ESV reception part 41 including copper.

Figure 5A:
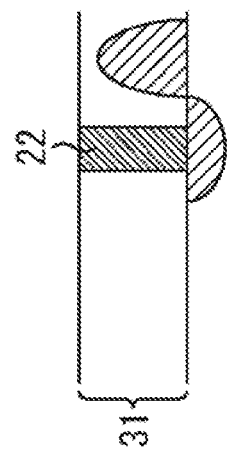
FIGS. 5A, 5B, and 5C are diagrams for explaining a manufacturing process of the second exemplary configuration illustrated in FIG. 4.
Figure 5B:
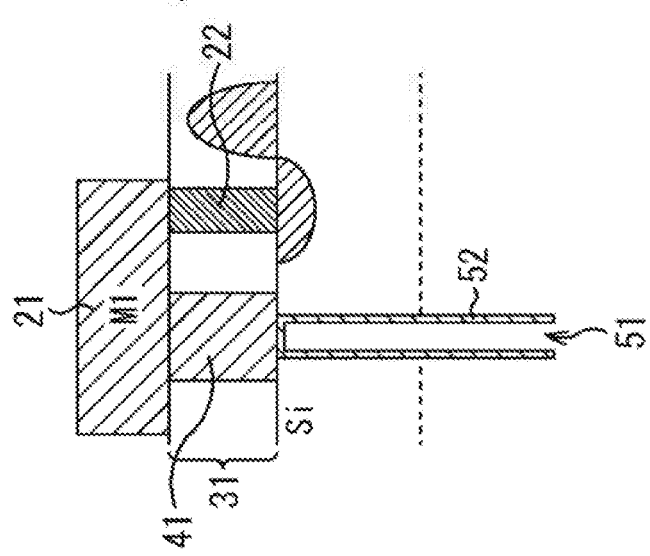
Figure 5C:
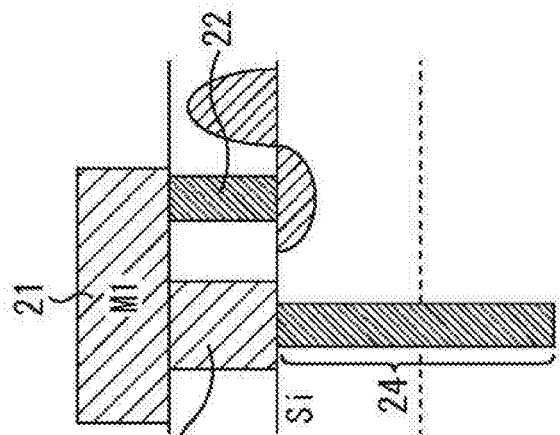

Next, FIGS. 5A, 5B, and 5C depict a manufacturing process of the second exemplary configuration of the connection portion between the ESV and the M1 wiring layer.

In a case of manufacturing the second exemplary configuration illustrated in FIG. 4, after forming the source contact 22 including tungsten on the interlayer film 31 as illustrated in FIG. 5A, the M1 wiring layer 21 and the ESV reception part 41, both of which include copper, are also formed simultaneously by a dual damascene method as illustrated in FIG. 5B. Further, the through hole 51 for the ESV 24 is opened to the ESV reception part 41 from a lower side in the figure, and the barrier metal 52 is formed on the inner wall of the through hole 51 by sputter film formation.

Thereafter, as illustrated in FIG. 5C, the through hole 51, in which the barrier metal 52 is formed, is filled with tungsten to form the ESV 24.

As described above, when the through hole for the ESV 24 is opened up to the ESV reception part 41 including copper, a length of the through hole becomes shorter, and an aspect ratio of the ESV 24 becomes smaller as compared with a case of forming the through hole for the ESV 24 up to the M1 wiring layer 21. It is advantageous in performing sputter film formation, and a barrier metal can be formed sufficiently.

Therefore, since an alloying reaction of tungsten and copper in the connection portion between the ESV 24 and the M1 wiring layer 21 can be restrained, it is possible to suppress increase of resistivity to a high level at the connection portion and to improve reliability of the electric connection using the ESV 24.

<Other Exemplary Configuration of a Layered Solid-State Imaging Device to which a Technology According to the Present Disclosure May be Applied>

Figure 6A:
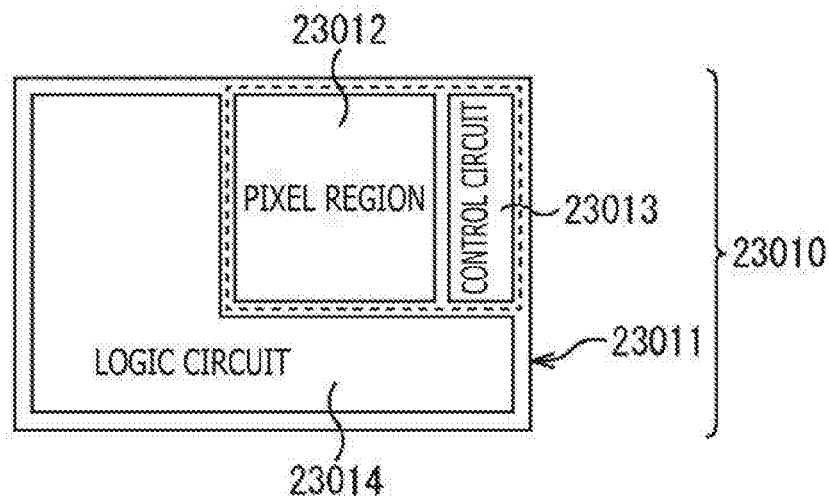
FIGS. 6A, 6B, and 6C are diagrams depicting an outline of an exemplary configuration of a layered solid-state imaging device to which a technology according to the present disclosure may be applied.
Figure 6B:
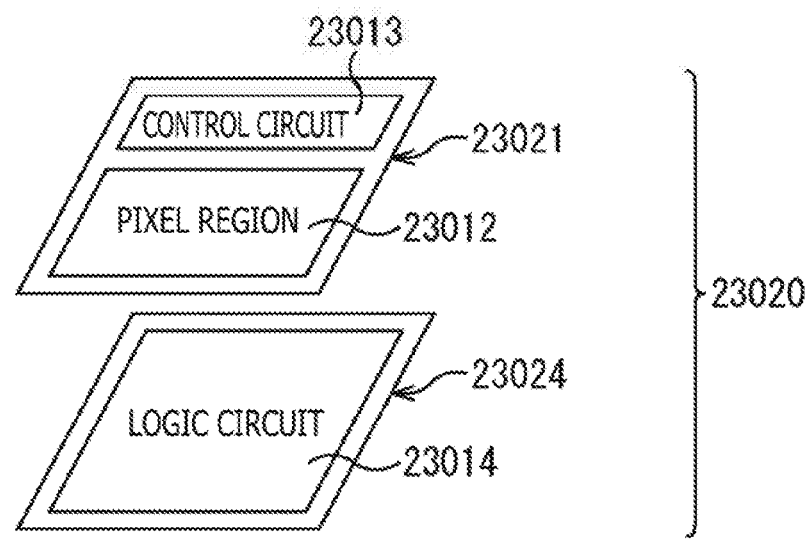
Figure 6C:
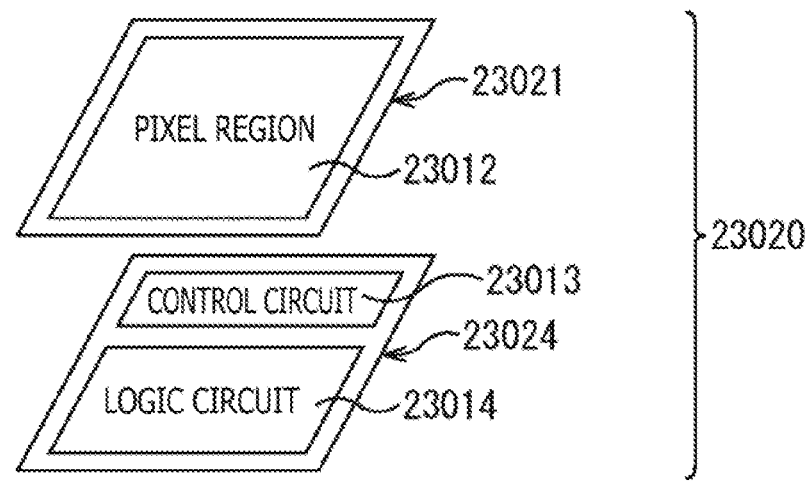

FIGS. 6A, 6B, and 6C are diagrams depicting an outline of an exemplary configuration of a layered solid-state imaging device to which a technology according to the present disclosure may be applied.

FIG. 6A depicts a schematic exemplary configuration of a non-layered solid-state imaging device. A solid-state imaging device 23010 has one die (semiconductor substrate) 23011 as illustrated in FIG. 6A. On the die 23011, there are mounted a pixel region 23012 in which pixels are arranged in an array, a control circuit 23013 for performing various controls such as driving the pixels, and a logic circuit 23014 for performing signal processing.

FIGS. 6A and 6B depict schematic exemplary configurations of the layered solid-state imaging device. As illustrated in FIGS. 6B and 6C in a solid-state imaging device 23020, two dies of a sensor die 23021 and a logic die 23024 are layered and electrically connected to configure one semiconductor chip.

In FIG. 6B, the pixel region 23012 and the control circuit 23013 are mounted on the sensor die 23021, and the logic circuit 23014 including a signal processing circuit for performing signal processing is mounted on the logic die 23024.

In FIG. 6C, the pixel region 23012 is mounted on the sensor die 23021, and the control circuit 23013 and the logic circuit 23014 are mounted on the logic die 23024.

FIG. 7 is a cross-sectional view depicting the first exemplary configuration of the layered solid-state imaging device 23020.

A PD configuring a pixel to be the pixel region 23012, an FD, a Tr (MOSFET), and a Tr configuring the control circuit 23013, etc. are formed on the sensor die 23021. Further, a plurality of layers, i.e. a wiring layer 23101 having three layers of wiring 23110 in this example, is formed on the sensor die 23021. The control circuit 23013 (the Tr to configure the control circuit 23013) can be configured not in the sensor die 23021 but in the logic die 23024.

A Tr that configures the logic circuit 23014 is formed on the logic die 23024. Further, a plurality of layers, i.e. a wiring layer 23161 having three layers of wirings 23170 in this example, is formed on the logic die 23024. Then, a connection hole 23171 in which an insulating film 23172 is formed on an inner wall surface is formed on the logic die 23024, and a connection conductor 23173 connected to the wirings 23170 etc. is embedded in the connection hole 23171.

The sensor die 23021 and the logic die 23024 are bonded together such that the wiring layers 23101 and 23161 face each other, thereby configuring the layered solid-state imaging device 23020 in which the sensor die 23021 and the logic die 23024 are layered. A film 23191 such as a passivation film is formed on a surface to which the sensor die 23021 and the logic die 23024 are bonded.

On the sensor die 23021, a connection hole 23111 is formed, which penetrates the sensor die 23021 from a back surface side (a side on which light is incident on the PD) (upper side) of the sensor die 23021 to reach the wiring 23170 on the uppermost layer of the logic die 23024. Further, in the sensor die 23021, a connection hole 23121 is formed in a vicinity of the connection hole 23111 to reach the first layer wiring 23110 from the back surface side of the sensor die 23021. An insulating film 23112 is formed on an inner wall surface of the connection hole 23111, and an insulating film 23122 is formed on an inner wall surface of the connection hole 23121. Then, connection conductors 23113 and 23123 are embedded in the connection holes 23111 and 23121, respectively. The connection conductor 23113 and the connection conductor 23123 are electrically connected on the back surface side of the sensor die 23021, whereby the sensor die 23021 and the logic die 23024 are electrically connected via the wiring layer 23101, the connection hole 23121, the connection hole 23111, and the wiring layer 23161.

Figure 8:
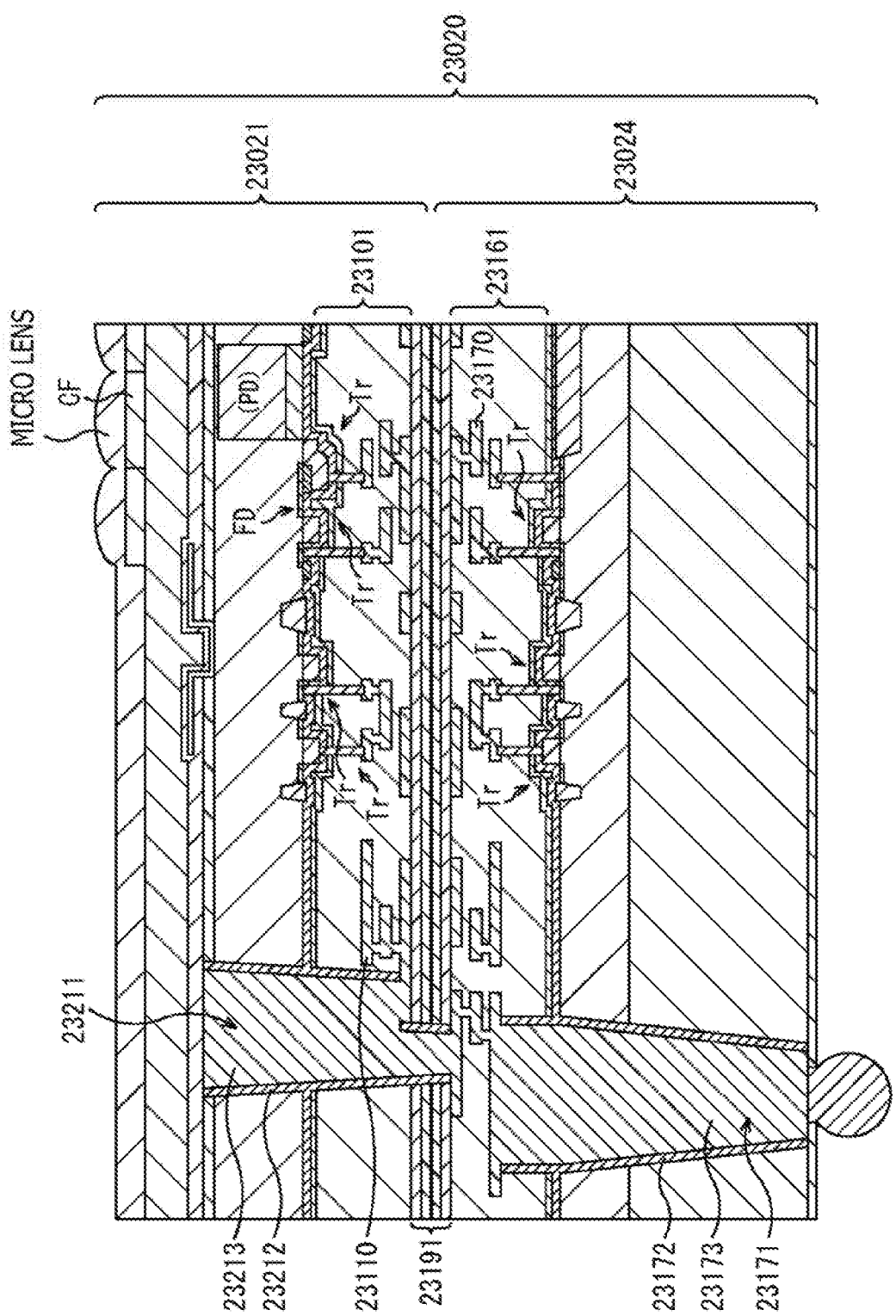
FIG. 8 is a cross-sectional view depicting a second exemplary configuration of the layered solid-state imaging device 23020.

FIG. 8 is a cross-sectional view depicting the second exemplary configuration of the layered solid-state imaging device 23020.

In the second exemplary configuration of the solid-state imaging device 23020, the sensor die 23021 ((the wiring 23110 of) the wiring layer 23101 thereof) and the logic die 23024 ((the wiring 23170 of) the wiring layer 23161 thereof) are electrically connected by one connection hole 23211 formed in the sensor die 23021.

That is, in FIG. 8, the connection hole 23211 is formed so as to penetrate the sensor die 23021 from the back surface side of the sensor die 23021 to reach the wiring 23170 on the uppermost layer of the logic die 23024, and to reach the wiring 23110 on the uppermost layer of the sensor die 23021. An insulating film 23212 is formed on an inner wall surface of the connection hole 23211, and a connection conductor 23213 is embedded in the connection hole 23211. In FIG. 7 described above, the sensor die 23021 and the logic die 23024 are electrically connected by two connection holes 23111 and 23121, whereas in FIG. 8, the sensor die 23021 and the logic die 23024 are electrically connected by one connection hole 23211.

Figure 9:
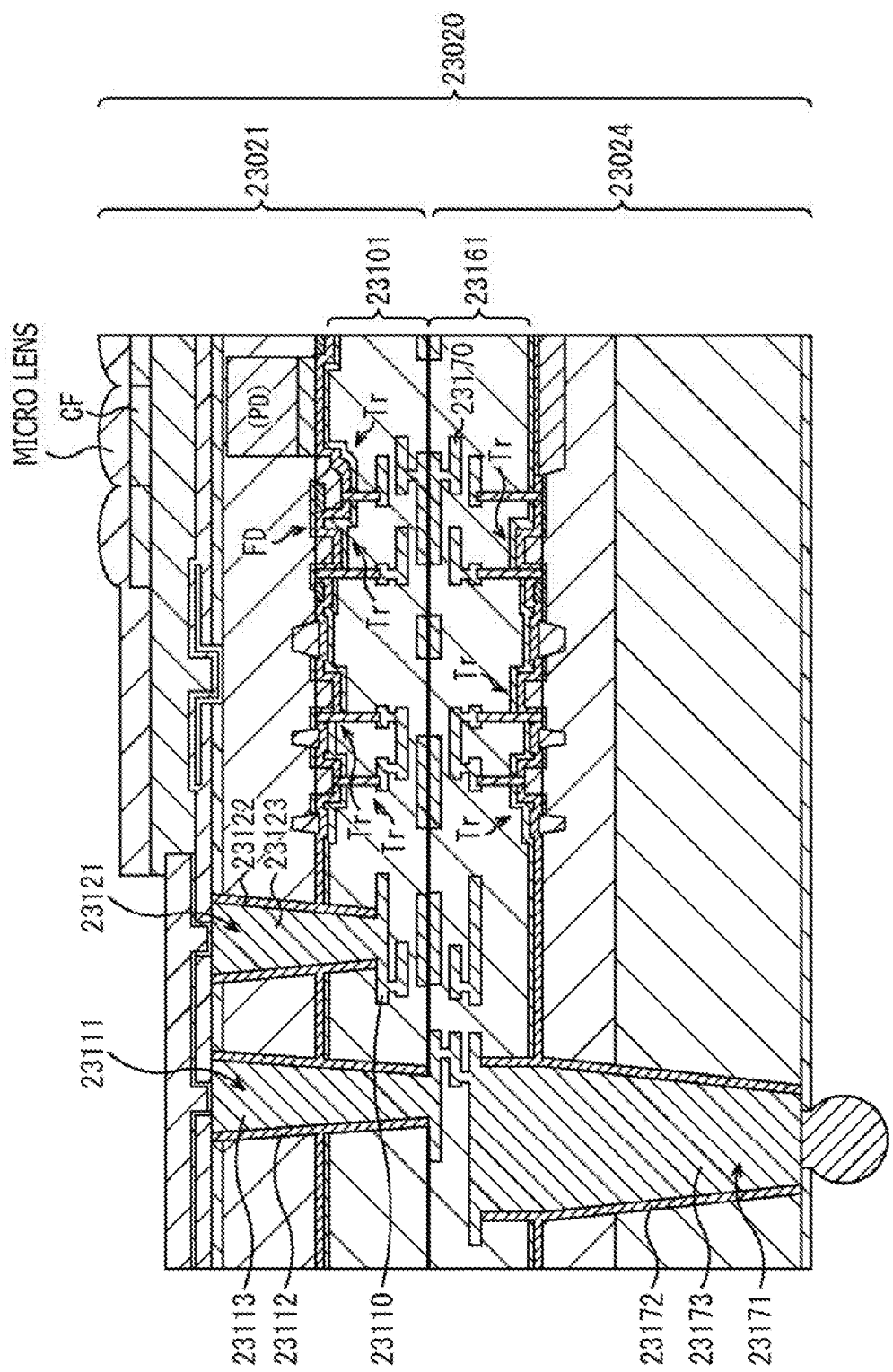
FIG. 9 is a cross-sectional view depicting a third exemplary configuration of the layered solid-state imaging device 23020.

FIG. 9 is a cross-sectional view depicting a third exemplary configuration of the layered solid-state imaging device 23020.

In the solid-state imaging device 23020 of FIG. 9, a film 23191 such as a passivation film is not formed on a surface to which the sensor die 23021 and the logic die 23024 are bonded, which is different from a case of FIG. 7 in which a film 23191 such as a passivation film is formed on a surface to which the sensor die 23021 and the logic die 23024 are bonded.

The solid-state imaging device 23020 of FIG. 9 is configured by superimposing the sensor die 23021 and the logic die 23024 such that the wirings 23110 and 23170 are in direct contact, and by heating them while applying a predetermined weight to bond the wirings 23110 and 23170 directly to each other.

Figure 10:
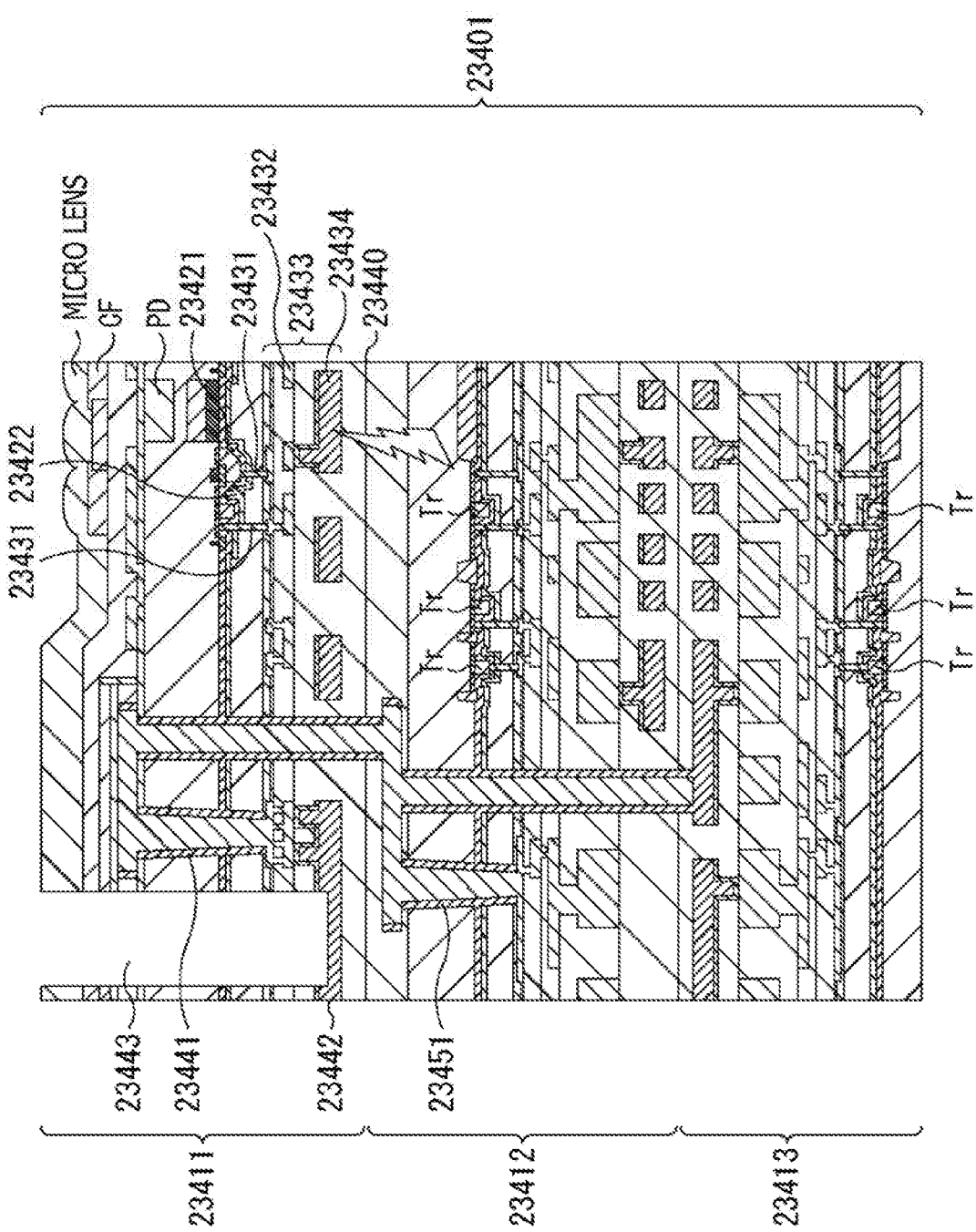
FIG. 10 is a cross-sectional view depicting another exemplary configuration of a layered solid-state imaging device to which a technology according to the present disclosure may be applied.

FIG. 10 is a cross-sectional view depicting another exemplary configuration of a layered solid-state imaging device to which a technology according to the present disclosure may be applied.

In FIG. 10, the solid-state imaging device 23401 has a three-layer layered structure in which three dies of a sensor die 23411, a logic die 23412, and a memory die 23413 are layered.

The memory die 23413 has, for example, a memory circuit for storing data temporarily necessary for signal processing performed in the logic die 23412.

In FIG. 10, the logic die 23412 and the memory die 23413 are layered in this order under the sensor die 23411. Inversely, the logic die 23412 and the memory die 23413 can be layered in a reverse order, i.e., in an order of the memory die 23413 and the logic die 23412, under the sensor die 23411.

In FIG. 10, a PD serving as a photoelectric conversion unit of pixels and a source/drain region of a pixel Tr are formed on the sensor die 23411.

A gate electrode is formed around the PD via a gate insulating film, and a pixel Tr 23421 and a pixel Tr 23422 are formed by a pair of source/drain regions and gate electrodes.

The pixel Tr 23421 adjacent to the PD is a transfer Tr, and one of the pair of source/drain regions configuring the pixel Tr 23421 is an FD.

In addition, an interlayer insulating film is formed on the sensor die 23411, and a connection hole is formed in the interlayer insulating film. In the connection hole, the pixel Tr 23421 and connection conductors 23431 connected to the pixel Tr 23422 are formed.

Furthermore, on the sensor die 23411, a wiring layer 23433 having a plurality of layers of wiring 23432 connected to each of the connection conductors 23431 is formed.

On a lowermost layer of the wiring layer 23433 of the sensor die 23411, an aluminum pad 23434 serving as an electrode for external connection is formed. That is, on the sensor die 23411, the aluminum pad 23434 is formed at a position closer to a bonding surface 23440 with the logic die 23412 than the wiring 23432. The aluminum pad 23434 is used as one end of a wiring related to input/output of signals with the outside.

In addition, a contact 23441 used for electrical connection with the logic die 23412 is formed on the sensor die 23411. The contact 23441 is connected to a contact 23451 of the logic die 23412 and also connected to an aluminum pad 23442 of the sensor die 23411.

A pad hole 23443 is formed in the sensor die 23411 so as to reach the aluminum pad 23442 from the back surface side (upper side) of the sensor die 23411.

The first exemplary configuration and the second exemplary configuration can be applied to the configuration of the connection hole of the first to third exemplary configurations of the layered solid-state imaging device 23020 described above. Accordingly, the alloying reaction can be restrained in the similar manner as described in the first exemplary configuration and the second exemplary configuration, so that it is possible to suppress increase of resistivity to a high level and to improve reliability of the electric connection. Further, an ESV can be applied to the connection holes of the first to third exemplary configurations of the layered solid-state imaging device 23020 described above. If the width of the connection hole is large, a large number of connection holes could not be installed. Since the ESV has a smaller diameter than through electrodes in the past, this problem can be solved.

<Application Example to an In-Vivo Information Acquisition System>

The technology according to the present disclosure (the present technology) can be applied to various products. For example, the technology according to the present disclosure can be applied to an endoscopic surgery system.

Figure 11:
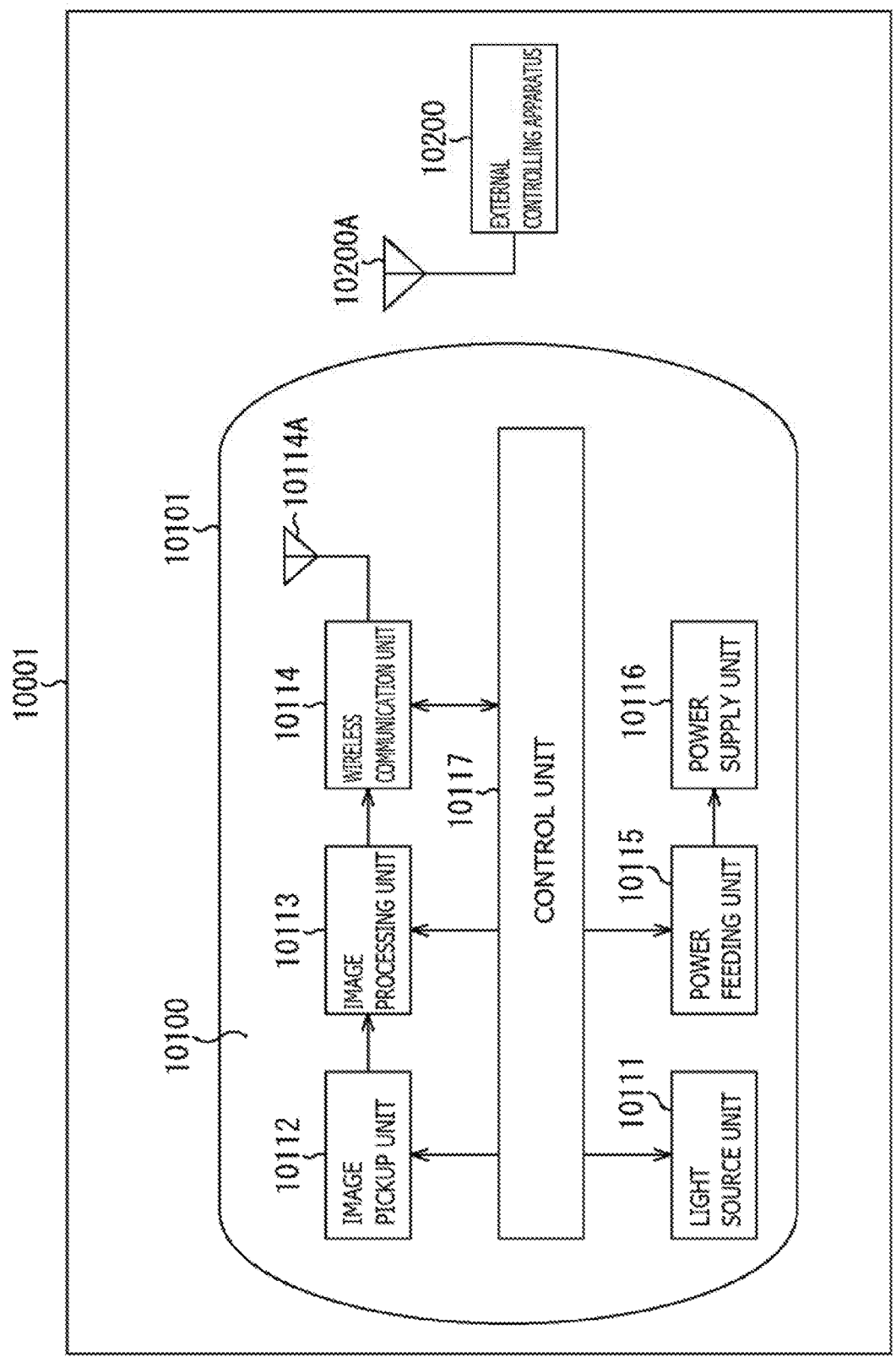
FIG. 11 is a block diagram depicting an example of a schematic configuration of an in-vivo information acquisition system.

FIG. 11 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 11, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

Heretofore, an example of the in-vivo information acquisition system to which the technology according to the present disclosure may be applied has been described. The technology according to the present disclosure may be applied to, for example, the image pickup unit 10112 among the configurations described above.

<Application Example to an Endoscopic Surgery System>

The technology according to the present disclosure (the present technology) can be applied to various products. For example, the technology according to the present disclosure may be applied to an endoscopic surgery system.

Figure 12:
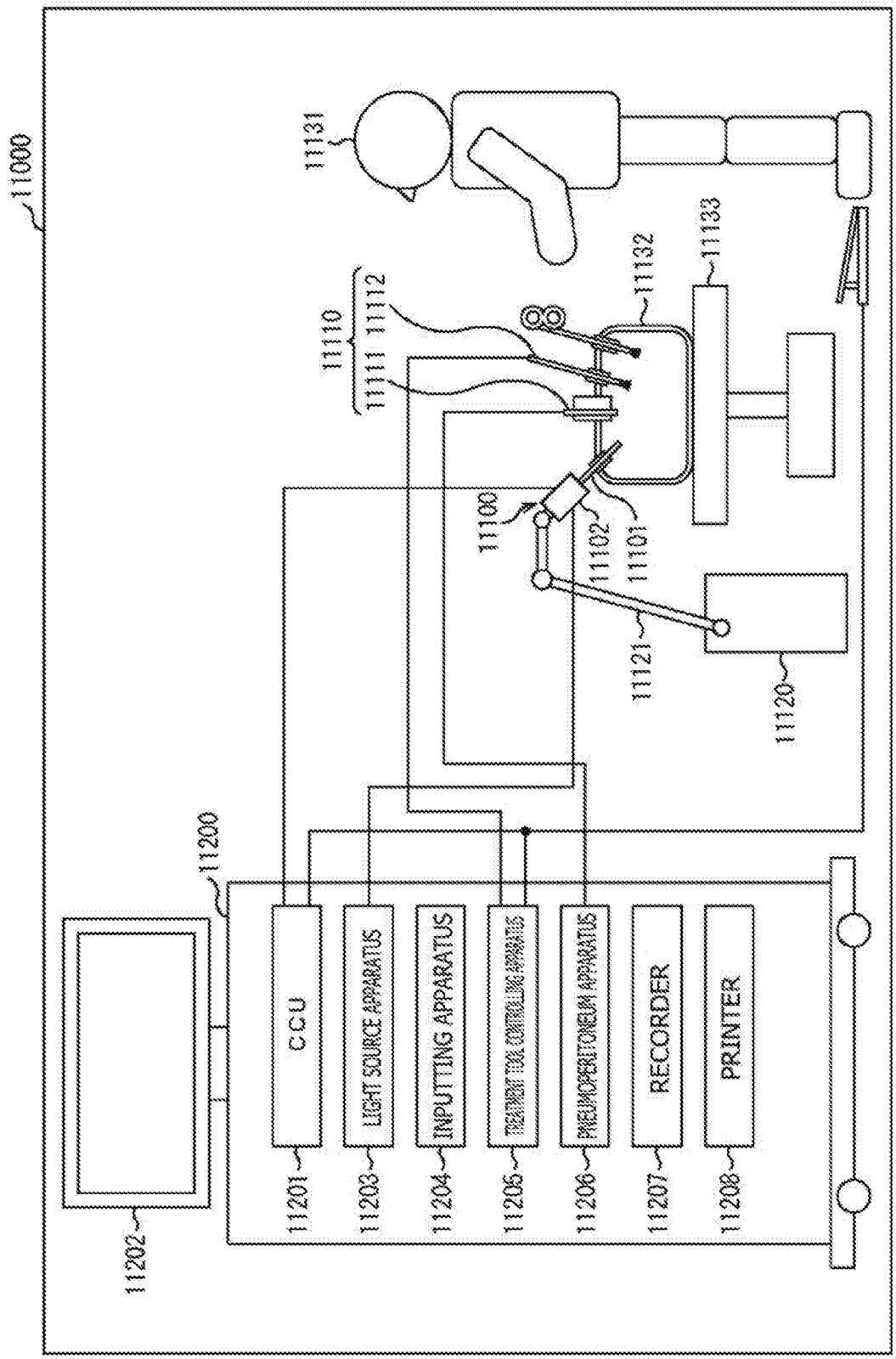
FIG. 12 is a view depicting an example of a schematic configuration of an endoscopic surgery system.

FIG. 12 is a view depicting an example of a schematic configuration of an endoscopic surgery system to which the technology according to an embodiment of the present disclosure (present technology) can be applied.

In FIG. 12, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 13:
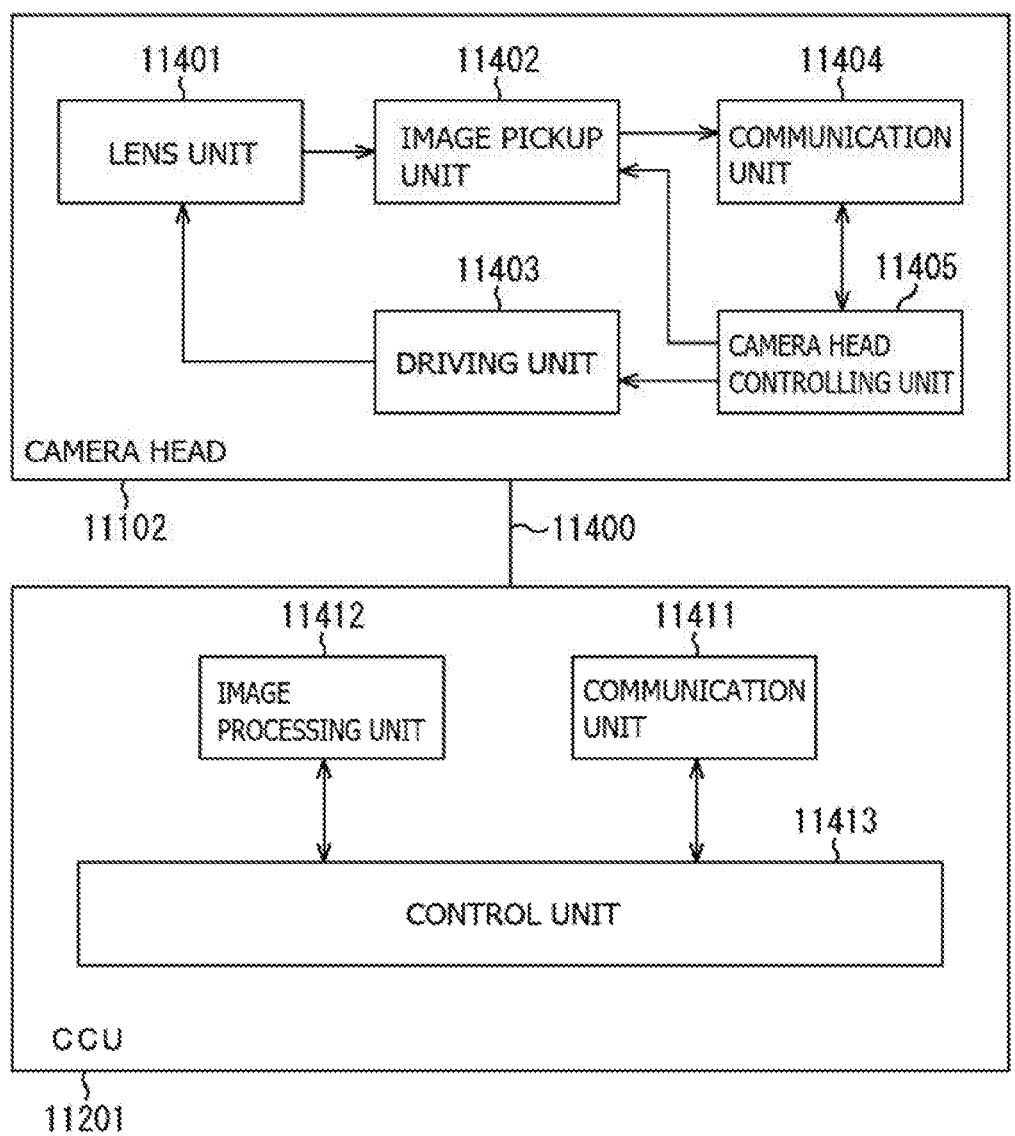
FIG. 13 is a block diagram depicting an example of a functional configuration of a camera head and a camera control unit (CCU).

FIG. 13 is a block diagram depicting an example of a functional configuration of the camera head 11102 and the CCU 11201 depicted in FIG. 12.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Heretofore, an example of the endoscopic surgery system to which the technology according to the present disclosure may be applied has been described. The technology according to the present disclosure may be applied to, for example, the image pickup unit 11402 of the camera head 11102 among the configurations described above.

Note that, although the endoscopic surgery system has been described herein by way of example, the technology according to the present disclosure may be applied to others, for example, a microscopic surgery system etc.

<Application Example to a Mobile Body>

The technology according to the present disclosure (the present technology) can be applied to various products. For example, the technology according to the present disclosure may be achieved as a device mounted on any type of mobile object such as an automobile, an electric vehicle, a hybrid electric vehicle, a motorcycle, a bicycle, personal mobility, an airplane, a drone, a ship, a robot, etc.

Figure 14:
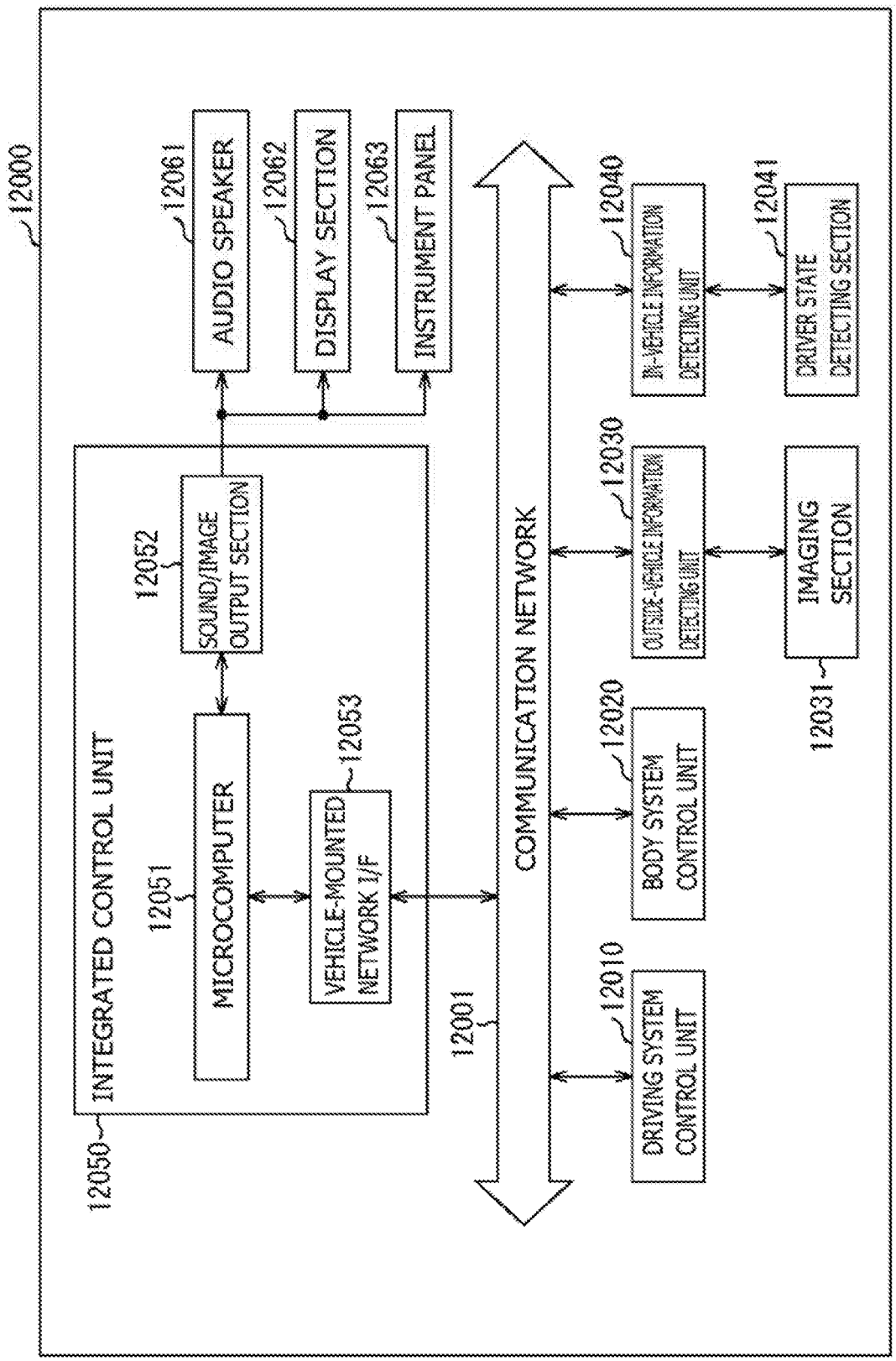
FIG. 14 is a block diagram depicting an example of a schematic configuration of a vehicle control system.

FIG. 14 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 14, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 14, an audio speaker 12061, a display section 12062, and an instrument panel 12063 are illustrated as the output device. The display section 12062 may, for example, include at least one of an on-board display and a head-up display.

Figure 15:
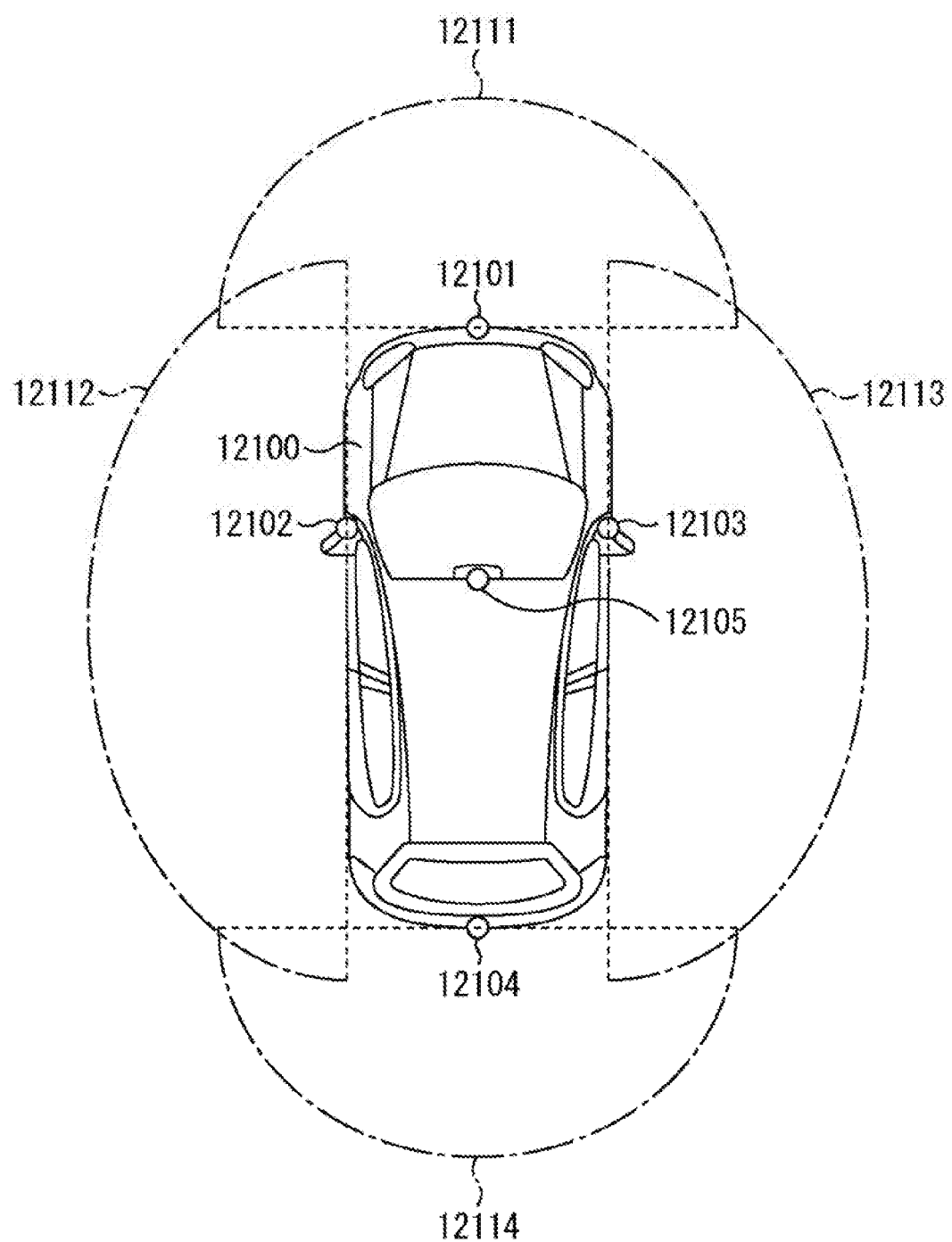
FIG. 15 is a diagram of assistance in explaining an example of installation positions of an outside-vehicle information detecting section and an imaging section.

FIG. 15 is a diagram depicting an example of the installation position of the imaging section 12031.

In FIG. 15, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 15 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

Heretofore, an example of the vehicle control system to which the technology according to the present disclosure may be applied has been described. The technology according to the present disclosure may be applied to, for example, the imaging section 12031 among the configurations described above.

Note that the embodiments of the present technology are not limited to the above-described embodiments, and various modifications may be made without departing from the scope of the present technology.

The present technology can also be configured as follows.

(1)

A semiconductor device having a plurality of semiconductor substrates layered, the semiconductor device including:

a through electrode penetrating a silicon layer of the semiconductor substrates;

a wiring layer formed inside the semiconductor substrates; and a through electrode reception part connected to the wiring layer, in which the through electrode has a width smaller than the through electrode reception part, and the through electrode is electrically connected to the wiring layer via the through electrode reception part.

(2)

The semiconductor device according to (1), in which the through electrode reception part is formed by the same metal as the through electrode or the wiring layer.

(3)

The semiconductor device according to (1) or (2), in which the through electrode reception part and the through electrode include tungsten.

(4)

The semiconductor device according to any one of (1) to (3), further including:

a source contact connected to the wiring layer, in which the through electrode reception part is formed simultaneously with the source contact.

(5)

The semiconductor device according to (1) or (2), in which the through electrode reception part and the wiring layer include copper.

(6)

The semiconductor device according to (5), in which the through electrode reception part is formed simultaneously with the wiring layer by a dual damascene method.

(7)

The semiconductor device according to any one of (1) to (6), in which a barrier metal is formed at an interface between the through electrode reception part and the through electrode.

(8)

The semiconductor device according to any one of (1) to (7), in which the barrier metal is provided on a side wall of the through electrode.

(9)

The semiconductor device according to any one of (1) to (8), in which the barrier metal is provided on a side wall of the through electrode reception part.

(10)

The semiconductor device according to any one of (1) to (9), in which the barrier metal includes titanium or titanium nitride.

(11)

The semiconductor device according to any one of (1) to (10), in which the through electrode includes an ESV (Extreme Small Through Silicon Via).

(12)

The semiconductor device according to any one of (1) to (11), in which a diameter of the through electrode is 1 [μm] or less, and an aspect ratio is 10 or more.

(13)

A solid-state imaging device having a plurality of semiconductor substrates layered, a PD (photodiode) formed on at least one semiconductor substrate among the plurality of the semiconductor substrates, the solid-state imaging device including:

a through electrode penetrating a silicon layer of the semiconductor substrates;

a wiring layer formed inside the semiconductor substrates; and a through electrode reception part connected to the wiring layer, in which the through electrode has a width smaller than the through electrode reception part, and the through electrode is electrically connected to the wiring layer via the through electrode reception part.

(14)

Electronic equipment having a plurality of semiconductor substrates layered, the electronic equipment including:

a through electrode penetrating a silicon layer of the semiconductor substrates;

a wiring layer formed inside the semiconductor substrates; and a through electrode reception part connected to the wiring layer, in which the through electrode has a width smaller than the through electrode reception part, and the through electrode is electrically connected to the wiring layer via the through electrode reception part.

REFERENCE SIGNS LIST

10 Lower layer substrate, 11 Intermediate substrate 12 Upper layer substrate, 21 M1 wiring layer, 22 Source contact, 23 ESV reception part, 24 ESV, 31 Interlayer film, 41 ESV reception part, 51 Through hole, 52 Barrier metal

The invention claimed is:

1. A semiconductor device, comprising:
a plurality of semiconductor substrates;
a through electrode that penetrates a silicon layer of the plurality of semiconductor substrates;
a wiring layer inside the plurality of semiconductor substrates; and
a through electrode reception part connected to the wiring layer, wherein
a width of the through electrode is smaller than a width of the through electrode reception part,
the through electrode is electrically connected to the wiring layer via the through electrode reception part,
each of the through electrode reception part and the wiring layer includes copper, and
the through electrode reception part is formed concurrently with the wiring layer by a dual damascene method.

2. The semiconductor device according to claim 1, wherein the through electrode includes tungsten.

3. The semiconductor device according to claim 1, wherein a barrier metal is at an interface between the through electrode reception part and the through electrode.

4. The semiconductor device according to claim 3, wherein the barrier metal is on a side wall of the through electrode.

5. The semiconductor device according to claim 4, wherein the barrier metal includes one of titanium or titanium nitride.

6. The semiconductor device according to claim 1, wherein the through electrode includes a TSV (Through Silicon Via).

7. The semiconductor device according to claim 6, wherein
a diameter of the through electrode is 1 μm or less, and an aspect ratio of the through electrode is 10 or more.

8. A solid-state imaging device, comprising:
a plurality of semiconductor substrates;
a PD (photodiode) on at least one of the plurality of the semiconductor substrates;
a through electrode that penetrates a silicon layer of the plurality of semiconductor substrates;
a wiring layer inside the plurality of semiconductor substrates; and
a through electrode reception part connected to the wiring layer, wherein a width of the through electrode is smaller than a width of the through electrode reception part, the through electrode is electrically connected to the wiring layer via the through electrode reception part, each of the through electrode reception part and the wiring layer includes copper, and the through electrode reception part is formed concurrently with the wiring layer by a dual damascene method.

9. An electronic equipment, comprising:

a plurality of semiconductor substrates;

a through electrode that penetrates a silicon layer of the plurality of semiconductor substrates;

a wiring layer inside the plurality of semiconductor substrates; and a through electrode reception part connected to the wiring layer, wherein a width of the through electrode is smaller than a width of the through electrode reception part, the through electrode is electrically connected to the wiring layer via the through electrode reception part, each of the through electrode reception part and the wiring layer includes copper, and the through electrode reception part is formed concurrently with the wiring layer by a dual damascene method.

* * * * *